United States Patent [19]

Krisko et al.

[11] Patent Number: 5,352,505

[45] Date of Patent: Oct. 4, 1994

[54] PLASMA ENHANCED CHEMICAL VAPOR DEPOSITION OF OXIDE FILM STACK

[75] Inventors: Annette J. Krisko, Highland; James W. Proscia, Dearborn, both of Mich.

[73] Assignee: Ford Motor Company, Dearborn, Mich.

[21] Appl. No.: 73,230

[22] Filed: Jun. 4, 1993

Related U.S. Application Data

[62] Division of Ser. No. 724,275, Jul. 1, 1991.

[51] Int. Cl.[5] .............................................. G02F 1/17
[52] U.S. Cl. .................................... 428/216; 428/212; 428/446; 428/701; 428/702
[58] Field of Search ................ 428/701, 702, 446, 216, 428/212

[56] References Cited

U.S. PATENT DOCUMENTS

| | | | |
|---|---|---|---|
| 3,991,228 | 11/1976 | Carlson et al. | 427/166 |
| 4,140,814 | 2/1979 | Hynecek | 427/166 |
| 4,239,350 | 12/1980 | Morita et al. | 350/357 |
| 4,252,838 | 2/1981 | Board et al. | 427/166 |
| 4,303,310 | 12/1981 | Morita et al. | 350/357 |
| 4,306,773 | 12/1981 | Arnoldussen | 204/164 |
| 4,338,000 | 7/1982 | Kamimoii et al. | 350/357 |
| 4,351,856 | 9/1982 | Matsui et al. | 428/428 |
| 4,449,790 | 5/1984 | Thoni | 350/357 |
| 4,451,498 | 5/1984 | Hashimoto et al. | 427/38 |
| 4,505,949 | 3/1985 | Jelks | 427/38 |
| 4,508,792 | 4/1985 | Ishiwata | 427/38 |
| 4,560,634 | 12/1985 | Matsuo et al. | 427/39 |
| 4,572,841 | 2/1986 | Kaganowicz et al. | 427/39 |
| 4,664,934 | 5/1987 | Ito et al. | 427/38 |
| 4,687,560 | 8/1987 | Tracy et al. | 427/38 |
| 4,777,061 | 10/1988 | Wu et al. | 427/39 |
| 4,876,983 | 10/1989 | Fukuda et al. | 427/38 |
| 4,886,571 | 12/1989 | Suzuki et al. | 427/38 |
| 4,918,033 | 4/1990 | Bartha et al. | 427/38 |
| 4,960,324 | 10/1990 | Brown | 350/357 |
| 4,980,198 | 12/1990 | Dowben et al. | 427/39 |
| 5,019,420 | 5/1991 | Rauh | 427/116 |
| 5,051,274 | 9/1991 | Goldner et al. | 427/38 |
| 5,055,319 | 10/1991 | Bunshah et al. | 427/116 |
| 5,086,351 | 2/1992 | Couput et al. | 427/164 |

FOREIGN PATENT DOCUMENTS 59-17538 1/1984 Japan.
2081992 2/1982 United Kingdom.

OTHER PUBLICATIONS

Abstracts of Japanese patent 56-130722 "Display Cell and its Manufacture", Morita, Oct. 1981, vol. 6 No. 5 (P-97) Jan. 1982.

Hashimoto, Patent Abstract of Japan, 60-144722 (Jul. 1985) "Production of Solid State Type Electrochromatic Display", vol. 314 (P-142) Oct. 1985.

Chung et al. Chemical Abstracts No. 96: 73076W, "Study on the CVD of $Al_2O_3$ for Increase in Wear Characteristics of Cemented Carbides", vol. No. 96, No. 10, Mar. 1982.

Tracy et al., J. of Vac. Sci. and Tech./Part A, vol. 4, No. 5, Sep. 1986, "Preparation of Amorphous Electrochromic $WO_3$, $MoO_3$ by PECVD".

Rauh et al., Abstract #565, "IR Reflectivity Modulation in LI inserted Electrochromatic $WO_3$ films", Extended Abstracts, vol. 84 No. 2, Oct. 1984.

Primary Examiner—A. A. Turner
Attorney, Agent, or Firm—Lorraine S. Melotik; Roger L. May

[57] ABSTRACT

A plasma enhanced chemical vapor deposition method is provided for depositing an oxide film onto a substrate surface. Deposition is achieved even onto a surface of a glass or other relatively non-receptive substrate. A subfilm is deposited under plasma enhanced chemical vapor deposition conditions more strongly favoring deposition, followed by deposition of the desired oxide film under second plasma enhanced chemical vapor deposition conditions less strongly favoring deposition. High quality oxide films can be achieved by deposition at second plasma enhanced chemical vapor deposition conditions only marginally favoring deposition over etching.

2 Claims, 1 Drawing Sheet

PLASMA ENHANCED CHEMICAL VAPOR DEPOSITION OF OXIDE FILM STACK

This application is a division of application Ser. No. 07/724,275, filed on Jul. 1, 1991.

INTRODUCTION

This application is directed to a plasma enhanced chemical vapor deposition method of depositing an oxide, for example, tungsten oxide or other infrared reflective refractory oxide. It is especially applicable to deposition of an oxide on the surface of a substrate which is relatively non-receptive to such deposition.

BACKGROUND

An oxide film can be deposited on a substrate surface using a known method generally referred to as plasma enhanced chemical vapor deposition ("PECVD"), also known as glow discharge deposition. This known method is used commercially, for example, to deposit films of photovoltaic material on a substrate in the production of solar cells. PECVD involves ionizing a gas mixture which includes the species to be deposited. For a film of tungsten oxide to serve as an electrode in an electrochromic device, for example, the gas mixture might comprise tungsten hexafluoride, oxygen and hydrogen gases.

Deposition of an oxide by PECVD involves a dynamic two-way process in which deposition and its opposite, surface etching, are occurring simultaneously. Conditions must be controlled to favor deposition over etching. Specifically, parameters such as the composition of the deposition atmosphere, the deposition temperature and ion bombardment energy, that is, the strength of any electrical field applied to accelerate ions of the plasma toward the substrate surface to be coated, as well as secondary parameters such as flow rate and pressure, and power level, all must be controlled to achieve deposition. More precisely, these factors must be controlled to achieve net deposition, that is, to sufficiently favor deposition over etching in the dynamic process that the net result is an accumulating deposit of the desired oxide.

Significantly, higher quality films, in particular, higher electronic quality films, are known to be achieved at PECVD deposition conditions only marginally favoring deposition over etching. Thus, for example, to achieve high quality films of crystalline tungsten oxide, the deposition conditions preferably are maintained close to those favoring etching. Unfortunately, however, oxide films often are not readily formed on certain smooth surfaces at such marginal PECVD conditions. There is some speculation that this deposition difficulty may be due to a lack of nucleation sites on such smooth surfaces. In any event, there has been difficulty in using PECVD techniques to form high quality oxide films on certain substrates, such as glass and electronic quality dielectric substrates. While directed to deposition of a metal, tungsten, rather than an oxide, the difficulty of chemical vapor deposition onto dielectric surfaces, such as silicon dioxide, is shown generally in U.S. Pat. No. 4,777,061 to Wu et al. The Wu et al patent suggests an argon plasma pretreatment of the dielectric surface followed by low power plasma deposition of tungsten, followed by thermal deposition of tungsten. That is, the Wu et al patent teaches that plasma deposition is terminated after deposition of an adhesion film, following which deposition proceeds by thermal decomposition. Plasma enhanced chemical vapor deposition also is discussed in U.S. Pat. No. 4,572,841 to Kaganowicz et al. An improved film having increased density is said to be achieved in the Kaganowicz patent by introducing excess hydrogen into the gaseous atmosphere during deposition. An optional first step is said to involve oxidizing the surface of the silicon substrate by a plasma oxidation method.

It is an object of the present invention to provide a PECVD deposition method to form oxide films on substrate surfaces. This and additional objects and features of the invention will be better understood from the disclosure and discussion which follow.

SUMMARY OF THE INVENTION

In accordance with a first aspect of the invention, a plasma enhanced chemical vapor deposition method is provided for depositing an oxide film onto a surface of a substrate. The method comprises the steps of depositing a sub-film onto the surface at first PECVD conditions, followed by deposition of the oxide film over the sub-film at second PECVD conditions. To achieve net deposition and substantially uniform film coverage, even over substrate surfaces which are relatively non-receptive to deposition by plasma enhanced chemical vapor deposition methods, the first PECVD conditions used in depositing the sub-film can strongly favor deposition over etching. That is, one or more of the deposition conditions, such as the composition of the deposition atmosphere, its pressure and flow rate, deposition temperature, ion bombardment energy and power level, are controlled to sufficiently favor deposition over etching to achieve net deposit of the sub-film. The second PECVD conditions, however, while still favoring deposition over etching, less favor deposition than do the first PECVD conditions. Thus, the second PECVD conditions may only marginally favor deposition over etching, such that an oxide film of higher quality than the sub-film is deposited. Nevertheless, net deposition of a substantially uniform and high quality oxide film can be achieved by plasma enhanced chemical vapor deposition at marginal deposition conditions, notwithstanding that the substrate may be relatively non-receptive to PECVD deposition, after first depositing the sub-film over the substrate. While not wishing to be bound by theory, it presently is understood that net deposition of the oxide film over the entire surface is promoted by the sub-film deposited first onto the substrate surface at the aforesaid first PECVD conditions which more favor deposition over etching than do the second PECVD conditions.

According to a second, particularly significant aspect of the invention, a glazing unit is provided comprising a substrate of glass, such as soda-lime glass typically used in architectural and automotive glazing applications, and the oxide film is a refractory oxide, most preferably tungsten oxide, to provide infrared reflectivity. Such film may be used, for example, for solar load control, that is, to reduce the amount of solar energy in the form of infrared radiation passing through the glazing unit to an enclosed space. Rejection of such infrared solar energy reduces the amount of air conditioning required to cool the enclosed space. According to this aspect of the invention, the above described differential plasma enhanced chemical vapor deposition conditions are employed for depositing a sub-film, for example, of amorphous tungsten oxide, followed by a film of preferably crystalline tungsten oxide.

Several significant advantages may be realized in accordance with preferred embodiments of the present invention. Most notably, plasma enhanced chemical vapor deposition may be used to deposit oxide films even on surfaces which are relatively non-receptive to PECVD deposition. Moreover, the oxide films deposited in accordance with the invention may be high quality films deposited under PECVD conditions only marginally favoring deposition, notwithstanding the non-receptive nature of the substrate surface. These and additional advantages and features of the invention will be better understood from the following detailed discussion of certain preferred embodiments.

BRIEF DESCRIPTION OF THE DRAWINGS

Certain preferred embodiments of the invention are considered in the following detailed description in conjunction with the accompanying drawing in which.

Figure 1:
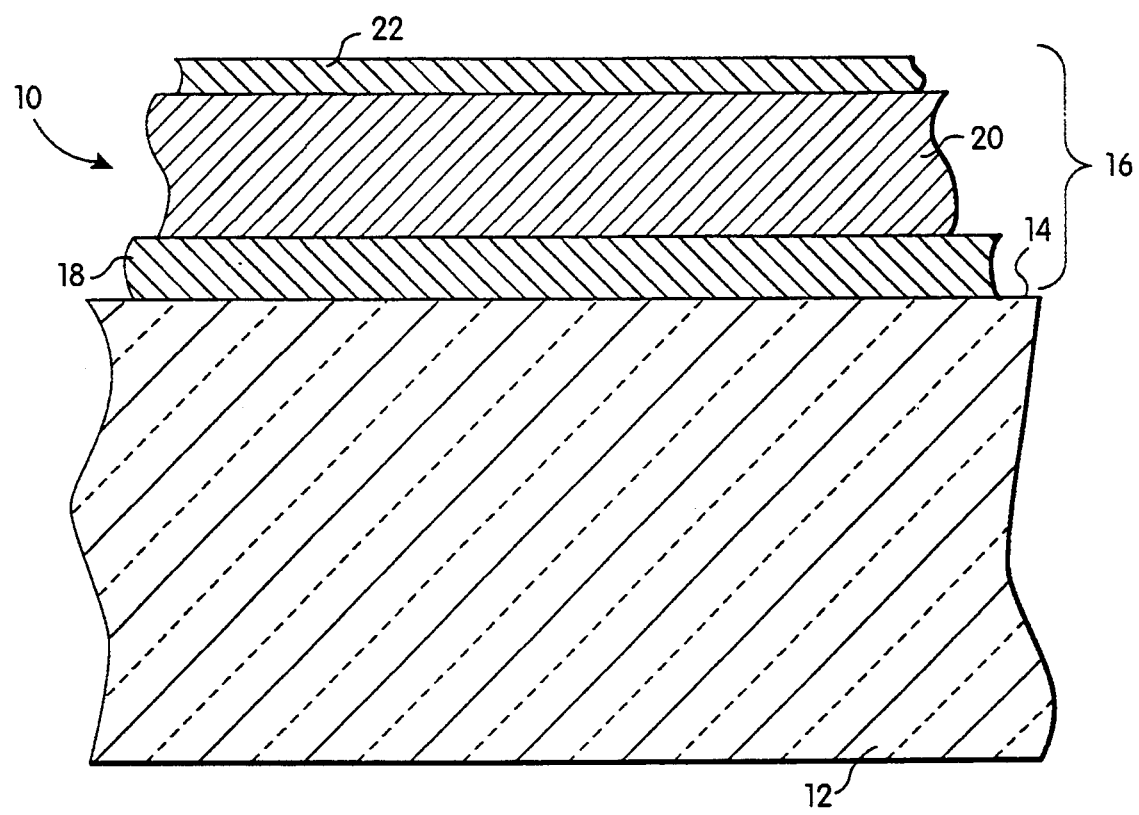
FIG. 1 is a cross sectional side view, partially broken away, illustrating an article comprising a substrate and an infrared reflective film stack on a surface of the substrate.

It should be understood that FIG. 1 is not drawn to scale. In particular, the films on the substrate surface are enlarged for clarity of illustration and ease of understanding.

DETAILED DESCRIPTION OF CERTAIN PREFERRED EMBODIMENTS

Plasma enhanced chemical vapor deposition of an oxide film on a substrate surface is well known, generally, to those skilled in the art. Various oxide films are desirable due to their high conductivity, giving them application as an electronic and/or ionic conductor in electrochemical devices. In such applications, the oxide film will typically be deposited on the surface of a tin oxide or other semi-conductor substrate. Certain such oxide films also have excellent properties for reflecting solar infrared radiation, giving them application as solar load control films for glazing units and the like. As noted above, however, plasma enhanced chemical vapor deposition is a dynamic, two-way process in which both oxide deposition and surface etching (removing the deposited oxide) are occurring simultaneously. It is well known to those skilled in the art that deposition conditions must be balanced to yield net deposition of the oxide. That is, a deposition rate greater than the rate of surface etching.

In accordance with certain highly preferred embodiments of the invention, an oxide film, most preferably a tungsten oxide film, is deposited onto a relatively non-receptive surface, for example, a glass, semi-conductor or other surface on which tungsten oxide normally does not accumulate well as a film under marginal PECVD conditions required for high quality film formation, such as electronic quality film formation or other crystalline tungsten oxide film formation. This is accomplished according to such preferred embodiments by initially depositing a sub-film onto the substrate surface under first PECVD conditions which more strongly favor deposition over etching. More specifically, the first PECVD conditions sufficiently favor deposition of the oxide that the sub-film accumulates on the surface notwithstanding that the surface normally is relatively non-receptive to PECVD deposition of the oxide. The sub-film need only be thick enough to render the surface sufficiently receptive to deposition (i.e., net film formation) of the desired higher quality tungsten oxide or other oxide film thereover. The sub-film preferably is about 100 to 1,000 Angstroms thick.

The material employed for the sub-film preferably is an oxide, such as a metal oxide, preferably tungsten oxide. According to certain highly preferred embodiments of the invention, the sub-film is amorphous tungsten oxide. Since the sub-film is deposited under conditions strongly favoring deposition over etching, it can be expected that a tungsten oxide sub-film in accordance with the invention will not be crystalline or electronic quality film. Rather, such tungsten oxide sub-film typically will be amorphous tungsten oxide. Most preferably for use under a high quality, crystalline tungsten oxide film, an amorphous tungsten oxide sub-film is approximately 100 to 1,000 Angstroms thick, most preferably about 500 Angstroms thick. Alternative materials for the sub-film will be readily apparent to those skilled in the art in view of the present disclosure. Exemplary such alternative materials include silicon carbide, silicon nitride, titanium dioxide, tin oxide and diamond.

The thickness of the high quality oxide film deposited at second PECVD conditions over the sub-film will depend largely on the particular application for which the film is intended. It is within the ability of those skilled in the art to select appropriate film thicknesses for intended applications. In certain most preferred embodiments of the invention, wherein an amorphous tungsten oxide sub-film is used under a substantially transparent, infrared reflective, substantially stoichiometric crystalline tungsten oxide top film is intended for automotive or architectural glazing applications, the crystalline tungsten oxide top film preferably is about 500 to 10,000 Angstroms thick, more preferably about 2,000 to 4,000 Angstroms, most preferably about 2,000 Angstroms thick.

While tungsten oxide is preferred, other known refractory metal oxides which may be deposited by plasma enhanced chemical vapor deposition in accordance with the present invention include, for example, titanium dioxide and tin oxide. Suitable oxides in addition to the aforesaid materials will be readily apparent to those skilled in the art in view of the present disclosure. Also, it will be within the ability of those skilled in the art to match suitable sub-film materials to the material of the desired oxide film in accordance with the general principles disclosed and discussed herein. In addition, the oxide material, especially crystalline tungsten oxide, may be doped or oxygen deficient to effect its properties. Thus, in accordance with one preferred embodiment, a fluorine doped crystalline tungsten oxide film is deposited in accordance with the invention over an amorphous tungsten oxide sub-film. The sub-film also may be fluorine doped or oxygen deficient. The tungsten oxide may be deposited slightly oxygen deficient or doped to increase its conductivity. In general, it will be apparent to those skilled in the art in view of the present disclosure, that other modifications and variations of the deposited oxide sub-film and film may be employed in practicing consistent with the present invention. As used hereinafter the term oxide is intended to mean all such doped, oxygen deficient and/or otherwise modified oxide materials. Thus, in particular, the term tungsten oxide hereinafter is intended to mean tungsten oxide which may or may not be doped, for example, fluorine doped, oxygen deficient, etc.

Referring now specifically to FIG. 1, a glazing article 10, such as a motor vehicle windshield or an architectural glazing unit, is seen to comprise a planer substrate 12 preferably comprising glass, more preferably soda-lime glass. Solar load control coating 16 has been deposited by plasma enhanced chemical vapor deposition onto surface 14 of glass substrate 12. Coating 16 includes a sub-film 18 of amorphous tungsten oxide directly on surface 14. Sub-film 18 has been deposited under first PECVD conditions, discussed further below, which strongly favor deposition over etching. Film 20 of high quality, substantially stoichiometric, substantially transparent, substantially crystalline tungsten oxide has been deposited under second PECVD conditions directly onto sub-film 18. The second PECVD conditions only marginally favor deposition over etching, resulting in the high quality of film 20. Sub-film 18 is about 100 to 1,000 Angstroms thick. Film 20 is about 2,000 to 4,000 Angstroms thick. A protective film 22 has been deposited by PECVD, sputtering or other suitable method directly on film 20 of crystalline tungsten oxide. In the preferred embodiment illustrated in FIG. 1, protective film 22, is silicon dioxide about 5,000 to 50,000 Angstroms thick. Those skilled in the art, however, will recognize in view of this disclosure, that numerous alternative materials will be suitable for protective film 22 including, for example, silicon nitride, diamond, and aluminium oxide. The glazing unit of FIG. 1 has excellent solar load control properties due, in part, to the infrared reflectivity of coating 16.

It will be within the ability of those skilled in the art, in view of the present disclosure, to select suitable PECVD conditions for deposition of the film and sub-film of the invention. With particular reference to the preferred embodiment of FIG. 1, first PECVD conditions suitable for deposition of the sub-film would be, for example, a deposition atmosphere consisting essentially of 25 sccm tungsten hexafluoride ($WF_6$), 25 sccm hydrogen ($H_2$), 50 sccm helium (He) and 50 sccm oxygen ($O_2$) at a pressure of 25 mTorr, with applied microwave power of 700 watts and substrate temperature of 125° C. These conditions will result in deposition of an amorphous tungsten oxide film onto a substrate such as soda-lime glass or a dielectric substrate. Deposition for one-half minute typically will result in a sub-film about 500 to 1,000 Angstroms thick, typically about 500 Angstroms thick.

A second set of PECVD deposition conditions suitable for depositing the higher quality crystalline tungsten oxide film over the amorphous tungsten oxide sub-film would be, for example, a deposition atmosphere consisting essentially of 25 sccm tungsten hexafluoride, 50 sccm hydrogen, 50 sccm helium, 50 sccm oxygen and 50 sccm carbon tetrafluoride ($CF_4$) at a pressure of 40 mTorr, with applied microwave power of 700 watts and a substrate temperature of 250° C. Deposition under the aforesaid second PECVD conditions for a period of about one minute results in a crystalline tungsten oxide film approximately 2,000 to 6,000 Angstroms thick, typically about 3,000 to 4,000 Angstroms thick. Those skilled in the art will recognize that the aforesaid second PECVD deposition conditions are marginal conditions in that they only marginally favor net deposition. That is, the second PECVD conditions only marginally favor deposition over surface etching. The film of crystalline tungsten oxide forms notwithstanding such marginal deposition conditions in view of the receptivity of the surface of the sub-film. Such receptivity to deposition is in contrast to the relatively non-receptive surface of the soda-lime glass substrate onto which the sub-film is deposited. The resulting film of crystalline tungsten oxide is actually at least substantially crystalline. It also is substantially transparent and substantially stoichiometric. Its properties include reflectivity of infrared radiation, notwithstanding that it is substantially transparent to visible light. The film also is sufficiently electrically conductive for use in certain electronic devices. In addition, those skilled in the art will recognize that the film stack, in appropriate thicknesses, may advantageously be employed in certain electrical devices, for example, as an electrode in an electrochromic device or the like, or as a resistance heating means for deicing or defogging a windshield or other glazing unit carrying the film stack.

Those skilled in the art will recognize that PECVD deposition parameters or conditions are to a large extent interrelated. Thus, a change in a first condition which would, by itself, result in deposition being more strongly favored over etching, may be more than offset by a change in one or a combination of other deposition conditions. Bearing this in mind, the following general guidelines regarding PECVD deposition of tungsten oxide films and sub-films for the preferred embodiment of the invention described above with reference to FIG. 1 are provided for elucidation and exemplification of the principles of the invention. In general, introduction of hydrogen gas into the deposition atmosphere, or increasing the concentration of hydrogen gas in the deposition atmosphere, will produce a higher quality tungsten oxide film while rendering the deposition conditions more marginal, that is, less favorable to deposition.

As in the preferred embodiment set forth above, the first PECVD conditions for deposition of the amorphous tungsten oxide sub-film preferably include a deposition atmosphere comprising no fluorine and less hydrogen, while the second PECVD conditions preferably include a deposition atmosphere comprising more hydrogen and 5 to 30 volume percent of a fluorine-containing reactant. Increasing deposition temperature, that is, the substrate temperature, also will produce a higher quality tungsten oxide film while rendering the PECVD conditions less favorable to deposition over etching. The PECVD conditions for deposition of the sub-film preferably include a deposition temperature in the range of room temperature to 200° C., while the second PECVD conditions for deposition of the higher quality crystalline tungsten oxide film thereover preferably include a deposition temperature of about 225° C. to 350° C. An additional condition which effects whether the conditions, as a whole, strongly or only marginally favor deposition over etching involves ion bombardment. Those skilled in the art are familiar with the use of an applied electric field to accelerate charged species and induce ion bombardment of the surface as deposition is occurring. In general, a stronger applied electric field results in more energetic ion bombardment and a higher quality film. However, etching or "sputtering" can occur at high ion energies. It will be within the ability of those skilled in the art, aided by the present disclosure, to select and control ion energy at suitable levels to yield strong or marginal deposition conditions, taken in conjunction with the other deposition parameters. The pressure of the deposition atmosphere may be lower during deposition of the sub-film to more strongly favor deposition over etching. Additionally, total flow rate and power level may be varied to effect deposition. Higher flow rate and higher power generally result in higher ion current density for ion bombardment.

Deposition methods and parameters for a protective film over the tungsten oxide film and sub-film, corresponding, for example, to film 22 of FIG. 1, will be readily apparent to those skilled in the art in view of the present disclosure. For deposition of a silicon dioxide protective film, for example, suitable methods include sputtering, chemical vapor deposition and the like. Thus, for example, suitable conditions for plasma enhanced chemical vapor deposition would be 50 sccm silane and 50 sccm carbon dioxide at a pressure of 25 mTorr, a microwave power of 500 watts and a substrate temperature of 250° C. Deposition under the aforesaid conditions for a time period of about one minute would result in a silicon dioxide protective film thickness of about 5,000 to 10,000 Angstroms.

It will be apparent to those skilled in the art that various modifications and variations can be made within the scope of the present invention. It is intended that all such obvious modifications and variations which fall within the true scope of this invention be included within the terms of the appended claims.

We claim:

1. An article comprising a substrate and an infrared reflective film stack on a surface of the substrate, the film stack comprising a 10 to 100 nm thick sub-film of amorphous tungsten oxide and a 50 to 1,000 nm thick film of substantially stoichiometric, crystalline tungsten oxide on the sub-film.

2. The article of claim 1 further comprising a 500 to 5,000 nm thick protective film of silicon dioxide over the film of crystalline tungsten oxide.

* * * * *